(12) United States Patent
Kim (10) Patent No.: US 8,860,295 B2
(45) Date of Patent: *Oct. 14, 2014

(54) DISPLAY DEVICES AND METHODS OF MANUFACTURING DISPLAY DEVICES

(71) Applicant: Samsung Display Co., Ltd., Yongin (KR)

(72) Inventor: Young-Bin Kim, Yongin (KR)

(73) Assignee: Samsung Display Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/953,560

(22) Filed: Jul. 29, 2013

(65) Prior Publication Data

US 2014/0016054 A1    Jan. 16, 2014

Related U.S. Application Data

(63) Continuation of application No. 13/325,353, filed on Dec. 14, 2011, now Pat. No. 8,519,620.

(30) Foreign Application Priority Data

Jun. 28, 2011    (KR) .......................... 10-2011-0062876

(51) Int. Cl.
*H01J 1/62*    (2006.01)
*H01L 29/786*    (2006.01)
*H01L 27/32*    (2006.01)

(52) U.S. Cl.
CPC .......... *H01L 29/786* (2013.01); *H01L 27/3272* (2013.01)
USPC .......................................... 313/498; 313/506

(58) Field of Classification Search
CPC .............. H01L 27/124; H01L 27/3244; H01L 27/14603
USPC .......................... 313/498, 505, 506, 509, 512
See application file for complete search history.

(56) References Cited

U.S. PATENT DOCUMENTS 7,095,048 B2    8/2006    Kawamura
7,768,585 B2    8/2010    Nakamura

FOREIGN PATENT DOCUMENTS

| KR | 1020050060005 | 6/2005 |
| KR | 1020070023269 | 2/2007 |
| KR | 1020070113120 | 11/2007 |
| KR | 1020080040886 | 5/2008 |

*Primary Examiner* — Vip Patel
(74) *Attorney, Agent, or Firm* — Knobbe Martens Olson & Bear LLP (57) ABSTRACT

A display device includes a substrate having a pixel region and a peripheral circuit region, peripheral circuits disposed in the peripheral circuit region, an insulation layer covering the peripheral circuits, a first electrode disposed on the insulation layer in the pixel region, at least one protection structure disposed on the insulation layer in the peripheral circuit region, and a light emitting structure or a liquid crystal layer disposed on the first electrode. The protection structure can prevent damage to the peripheral circuits caused by static electricity generated in manufacturing processes, so that the display device can have improved reliability while reducing defects of pixels in the display device.

20 Claims, 5 Drawing Sheets

DISPLAY DEVICES AND METHODS OF MANUFACTURING DISPLAY DEVICES

CROSS-REFERENCE TO RELATED APPLICATIONS

This application is a continuation of U.S. application Ser. No. 13/325,353, filed Dec. 14, 2011, which claims priority to Korean Patent Application No. 10-2011-0062876 filed on Jun. 28, 2011 in the Korean Intellectual Property Office (KIPO), the contents of which are herein incorporated by reference in their entireties.

BACKGROUND

1. Field

Some embodiments relate to display devices having protection structures and methods of manufacturing display devices having protection structures.

2. Description of the Related Technology

Generally, a liquid crystal display (LCD) device displays an image by controlling light transmittance of liquid crystal molecules aligned in a matrix structure in a liquid crystal layer in accordance with signals applied to the liquid crystal layer. A thin film transistor (TFT) is usually used as a switching device for providing the signals to the liquid crystal layer. Meanwhile, an organic light emitting display (OLED) device usually displays an image using colors of light generated from an organic light emitting layer disposed between two substrates thereof. In the OLED device, a thin film transistor is also used as a switching device for generating an electric field between two electrodes in the OLED device.

Static electricity may be generated while manufacturing a display device such as the liquid crystal display device or the OLED device. Peripheral circuits disposed in a peripheral circuit region of a glass substrate in the display device may be easily damaged by the static electricity. Therefore, failures of the display device may frequently occur and a reliability of the display device may be deteriorated. For example, a circuit element such as a gate driver may be easily damaged by the static electricity generated in manufacturing processes, so that line defects of pixels may often occur in the display device.

SUMMARY OF CERTAIN INVENTIVE ASPECTS

Some embodiments provide a display device including a protection structure for preventing damages to peripheral circuits caused by static electricity.

Some embodiments provide a method of manufacturing a display device including a protection structure for preventing damages to peripheral circuits caused by static electricity.

According to some embodiments, there is provided a display device. The display device can include a substrate including a pixel region and a peripheral circuit region, a plurality of transistors, an insulation layer, a first electrode, at least one protection structure, a pixel defining layer, a light emitting structure and a second electrode. The transistors can be disposed on the substrate. The insulation layer can be disposed on the substrate to cover the transistors. The first electrode can be disposed on the insulation layer in the pixel region. The at least one protection structure can be disposed on the insulation layer in the peripheral circuit region. The pixel defining layer can be disposed on first electrode and the protection structure to expose a portion of the first electrode. The light emitting structure can be disposed on the exposed portion of the first electrode. The second electrode can be disposed on the light emitting structure and the pixel defining layer.

The transistors in the peripheral circuit region can have different conductive types, respectively.

The first electrode can include a material substantially the same as or substantially similar to that of the protection layer. For example, each of the first electrode and the protection structure can include a transparent conductive material.

The first electrode can include a material different from that of the protection structure. For example, the first electrode and the protection structure can include different materials of metal, alloy, metal nitride, conductive metal oxide, etc.

The protection structure can be electrically connected to the second electrode in the peripheral circuit region.

The display device can include peripheral circuits, for example, a gate driver, a data driver and a timing controller, which can be disposed on the substrate in the peripheral circuit region. In this case, one the protection structure can entirely cover the peripheral circuits. In some embodiments, a plurality of protection structures can cover the peripheral circuits, respectively.

The insulation layer can include a first insulation film covering the transistors in the pixel region and the peripheral circuit region, and a second insulation film disposed on the first insulation film. The protection structure can be disposed on the first insulation film in the peripheral circuit region, and the first electrode can be disposed on the second insulation film in the pixel region.

According to some embodiments, there is provided a display device including a first substrate including a pixel region and a peripheral circuit region, a plurality of transistors, an insulation layer, a first electrode, at least one protection structure, a liquid crystal layer, a second electrode and a second substrate. The transistors can be disposed on the first substrate. The insulation layer can be disposed on the first substrate to cover the transistors. The first electrode can be disposed on the insulation layer in the pixel region. The at least one protection structure can be disposed on the insulation layer in the peripheral circuit region. The liquid crystal layer can be disposed on the first electrode. The second electrode can be disposed on the liquid crystal layer and the protection structure. The second substrate can be disposed on the second electrode.

The protection structure can be electrically connected to the second electrode.

The display devices can include peripheral circuits including a gate driver having the transistors, a data driver and a timing controller, which can be disposed on the first substrate in the peripheral circuit region. Here, one protection structure can entirely cover the peripheral circuits. In some embodiments, a plurality of protection structures can cover the peripheral circuits, respectively.

The first electrode and the protection structure can be disposed on one level or different levels.

According to some embodiments, there is provided a method of manufacturing a display device. In the method, peripheral circuits can be formed in a peripheral circuit region of a substrate including a pixel region and the peripheral circuit region. An insulation layer can be formed on the substrate to cover the peripheral circuits. A first electrode can be formed on the insulation layer in the pixel region. At least one protection structure can be formed on the insulation layer in the peripheral circuit region. A pixel defining layer can be formed on the first electrode and the protection structure to expose a portion of the first electrode. A light emitting structure can be formed on the exposed portion of the first electrode. A second electrode can be formed on the light emitting structure and the pixel defining layer.

After forming a conductive layer on the insulation layer, the first electrode and the protection structure can be respectively formed in the pixel region and the peripheral circuit region by patterning the conductive layer.

After forming a first insulation film on the substrate to cover the peripheral circuits, the protection structure can be formed on the first insulation film in the peripheral pixel region. A second insulation film can be formed on the first insulation film and the protection structure, and then the first electrode can be formed on the second insulation film in the pixel region.

According to some embodiments, there is provided a method of manufacturing a display device. In the method, peripheral circuits can be formed on in a peripheral circuit region of a first substrate including a pixel region and the peripheral circuit region. An insulation layer can be formed on the first substrate to cover the peripheral circuits. A first electrode can be formed on the insulation layer in the pixel region. At least one protection structure can be formed on the insulation layer in the peripheral circuit region. A liquid crystal layer can be formed on the first electrode. A second electrode can be formed on the liquid crystal layer and the protection structure. A second substrate can be formed on the second electrode.

After forming a conductive layer on the insulation layer, the conductive layer can be patterned to form one protection structure entirely covering the peripheral circuits or to form a plurality of protection structures covering the peripheral circuits, respectively.

According to some embodiments, a display device an organic light emitting display device or a liquid crystal display can include at least one protection structure covering peripheral circuits, so that the protection structure can effectively prevent damages to the peripheral circuits caused by static electricities generated in manufacturing processes for the display device. As a result, defects of pixel in the display device can be reduced and a reliability of the display device can be improved.

BRIEF DESCRIPTION OF THE DRAWINGS

Certain embodiments will be more clearly understood from the following detailed description taken in conjunction with the accompanying drawings. FIGS. 1 to 8 represent certain non-limiting embodiments as described herein.

DETAILED DESCRIPTION OF CERTAIN INVENTIVE EMBODIMENTS

Various embodiments will be described more fully hereinafter with reference to the accompanying drawings, in which some embodiments are shown. The invention can, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions can be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numerals generally refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 6 are cross-sectional views illustrating an embodiment of a method of manufacturing a display device. Although the method illustrated in FIGS. 1 to 6 can provide an organic light emitting display device, other flat panel display devices can be obtained by partially modifying processes illustrated in FIGS. 1 to 6.

Figure 1:
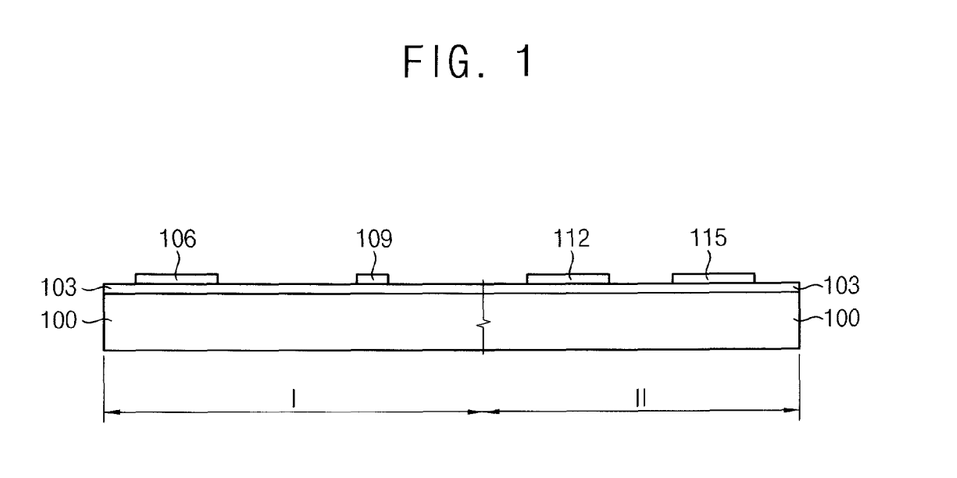
FIGS. 1 to 6 are cross-sectional views illustrating an embodiment of a method of manufacturing a display device.

Referring to FIG. 1, a first substrate 100 having a pixel region (I) and a peripheral circuit region (II) can be prepared. The first substrate 100 can include a transparent insulation substrate. The first substrate 100 can include a glass substrate, a quartz substrate, a transparent plastic substrate, a transparent ceramic substrate, and the like. The peripheral circuit region (II) is shown adjacent to the pixel region (I) for convenience in FIGS. 1 to 6. In other embodiments, the pixel region (I) can be separated from the peripheral circuit region (II) by a predetermined distance A plurality of pixel regions (I) can be provided at a central portion of the first substrate 100, and the peripheral circuit regions (II) can be disposed at a peripheral portion of the first substrate 100 to surround the pixel regions (I). The pixel region (I) can include driving transistors and the peripheral circuit region (II) can include switching transistors. These transistors can include thin film transistors or oxide semiconductor devices.

A buffer layer 103 can be formed on the first substrate 100. The buffer layer 103 can extend from the pixel region (I) to the peripheral circuit region (II). The buffer layer 103 can be formed using silicon compound. In some embodiments, the buffer layer 103 can be formed using silicon oxide (SiOx), silicon nitride (SiNx), silicon oxynitride (SiOxNy), silicon oxycarbide (SiOxCy), silicon carbonitride (SiCxNy), and the like. These can be used alone or in a combination thereof. The buffer layer 103 can be formed on the first substrate 100 by a chemical vapor deposition (CVD) process, a thermal oxidation process, a plasma enhanced chemical vapor deposition (PECVD) process, a high density plasma-chemical vapor deposition (HDP-CVD) process, a spin coating process, and the like. In some embodiments, the buffer layer 103 can have a single-layered structure or a multi-layered structure including at least one silicon compound film. The buffer layer 103 can prevent diffusion of metal atoms and/or impurities from the first substrate 100 in subsequent processes. When the buffer layer 103 is provided on the first substrate 100, the buffer layer 103 can control a heat transfer rate of a subsequent crystallization process. The buffer layer 103 can improve a flatness of an upper face of the first substrate 100 when the upper face of the first substrate 100 is relatively uniform. In some embodiments, the buffer layer 103 can not be formed on the first substrate 100 in accordance with ingredients and/or surface conditions of the first substrate 100.

A first semiconductor pattern 106, a lower electrode 109 of a storage capacitor, a second semiconductor pattern 112 and a third semiconductor pattern 115 can be formed on the buffer layer 103. The first semiconductor pattern 106 and the lower electrode 109 can be disposed in the pixel region (I), and the second and third semiconductor patterns 112 and 115 can be positioned in the peripheral circuit region (II).

In some embodiments, after forming a semiconductor layer (not illustrated) on the buffer layer 103, the semiconductor layer can be patterned to form a preliminary first semiconductor pattern (not illustrated) and a preliminary lower electrode (not illustrated) in the pixel region (I), and to form a preliminary second semiconductor pattern (not illustrated) and a preliminary third semiconductor pattern (not illustrated) in the peripheral circuit region (II). A crystallization process can be performed about the preliminary first to the preliminary third semiconductor patterns and the preliminary lower electrode to thereby form the first to third semiconductor patterns 106, 112 and 115 and the lower electrode 109 on the buffer layer 103. The semiconductor layer can be formed using amorphous silicon, amorphous silicon containing impurities, and the like. The semiconductor layer can be formed by a chemical vapor deposition process, a plasma enhanced chemical vapor deposition process, a low pressure chemical vapor deposition process, a sputtering process, and the like. The first to the third semiconductor patterns 106, 112 and 115 and the lower electrode 109 can include polysilicon, polysilicon containing impurities, partially crystallized silicon, silicon containing micro crystals, and the like. The first to the third semiconductor patterns 106, 112 and 115 and the lower electrode 109 can be formed by a laser irradiation process, a thermal process, a thermal process using a catalyst, and the like.

In some embodiments, after forming the semiconductor layer or forming the preliminary first to the preliminary third semiconductor patterns and the preliminary lower electrode, a dehydrogenation process can be performed about the semiconductor layer and/or the preliminary first to the preliminary third semiconductor patterns and the preliminary lower electrode. As a result, concentration(s) of hydrogen atoms in the semiconductor layer and/or the preliminary first to the preliminary third semiconductor patterns and the preliminary lower electrode can be reduced, so that electrical characteristics of the first to the third semiconductor patterns 106, 112 and 115 and the lower electrode 109 can be improved.

Figure 2:
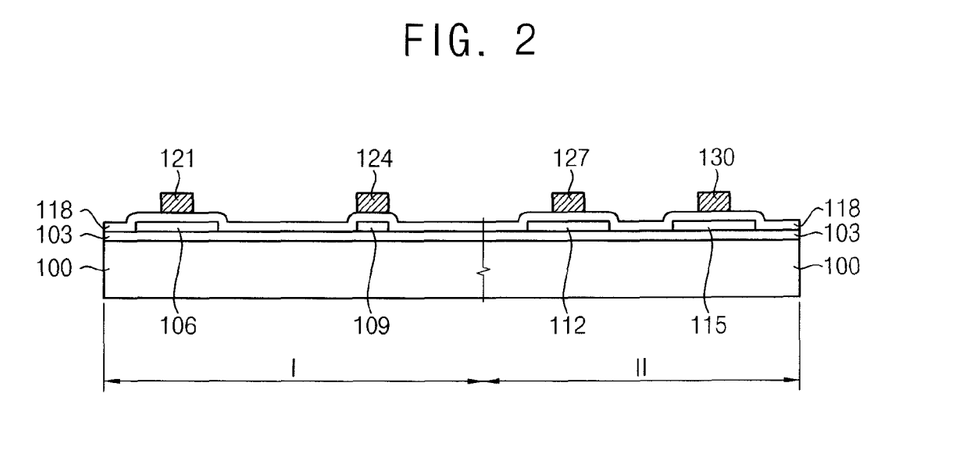

Referring to FIG. 2, a gate insulation layer 118 can be formed on the buffer layer 103 to cover the first to the third semiconductor patterns 106, 112 and 115 and the lower electrode 109. The gate insulation layer 118 can be formed using silicon oxide, metal oxide, and the like. Examples of metal oxide in the gate insulation layer 118 can include hafnium oxide (HfOx), aluminum oxide (AlOx), zirconium oxide (ZrOx), titanium oxide (TiOx), tantalum oxide (TaOx), and the like. These can be used alone or in a combination thereof. The gate insulation layer 118 can be formed on the buffer layer 103 by a chemical vapor deposition process, a spin coating process, a plasma enhanced chemical vapor deposition process, a sputtering process, a vacuum evaporation process, a high density plasma-chemical vapor deposition process, a printing process, and the like.

A first gate electrode 121, an upper electrode 124 of the storage capacitor, a second gate electrode 127 and a third gate electrode 130 can be formed on the gate insulation layer 118. Each of the first to the third gate electrodes 121, 127 and 130 and the upper electrode 124 can be formed using metal, alloy, metal nitride, conductive metal oxide, a transparent conductive material, and the like. The first to the third gate electrodes 121, 127 and 130 and the upper electrode 124 can be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and the like. These can be used alone or in a combination thereof.

In some embodiments, after forming a first conductive layer (not illustrated) on the gate insulation layer 118, the first conductive layer can be patterned by a photolithography process or an etching process using an additional mask, so that the first to the third gate electrode 121, 127 and 130 and the upper electrode 124 can be obtained. The first conductive layer can be formed by a sputtering process, a chemical vapor deposition process, a pulsed laser deposition (PLD) process, a vacuum evaporation process, an atomic layer deposition (ALD) process, and the like. The first gate electrode 121 and the upper electrode 124 can be disposed in the pixel region (I) while the second and the third gate electrode 127 and 130 can be positioned in the peripheral circuit region (II). Thus, the storage capacitor in the pixel region (I) can include the lower electrode 109, a portion of the gate insulation layer 118 and upper electrode 124.

A gate line (not illustrated) can be formed on a portion of the gate insulation layer 118 in the pixel region (I). The gate line can be provided adjacent to the first gate electrode 121, and the first gate electrode 121 can be connected with the gate line. The gate line can extend on the gate insulation layer 118 along a first direction.

Figure 3:
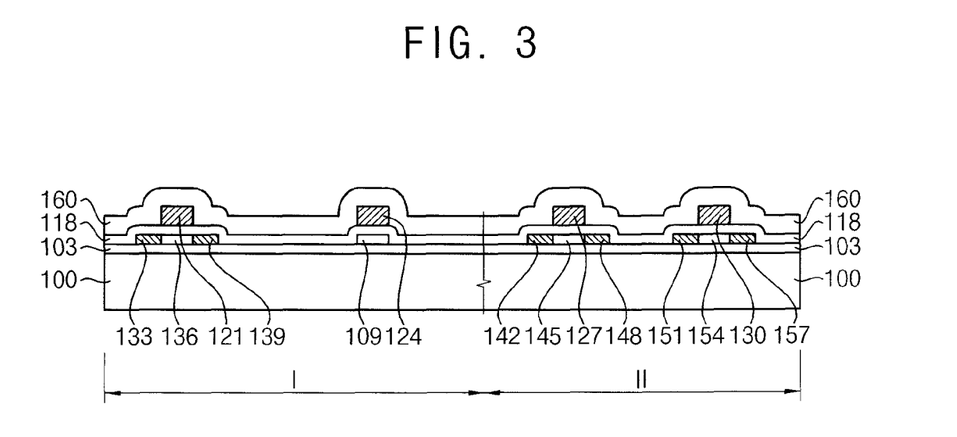

Referring to FIG. 3, impurities can be doped into the first to the third semiconductor patterns 106, 112 and 115 using the first to the third gate electrodes 121, 127 and 130 as masks. Thus, a first source region 133 and a first drain region 139 can be formed at lateral portions of the first semiconductor pattern 106. A second source region 142 and a second drain region 148 can be formed at lateral portions of the second semiconductor pattern 112. A third source region 151 and a third drain region 157 can be formed at lateral portions of the third semiconductor pattern 115. As formations of the first to the third source regions 133, 142 and 151 and the first to the third drain regions 139, 148 and 157, a first channel region 136, a second channel region 145 and a third channel region 154 can be defined in the first semiconductor pattern 106, the second semiconductor pattern 112 and the third semiconductor pattern 115, respectively. The first to the third channel regions 136, 145 and 154 can be positioned at central portions of the first to the third semiconductor patterns 106, 112 and 115, respectively.

In some embodiments, the impurities doped into the first to the third semiconductor patterns 106, 112 and 115 can vary in accordance with conductivity types of transistors provided in the pixel region (I) and the peripheral circuit region (II). When a first transistor such as an N-type first transistor is formed in the pixel region (I), N-type impurities can be doped into the first semiconductor pattern 106 to form the first source region 133 and the first drain region 139. When a second transistor and a third transistor having different conductivity types such as an N-type transistor and a P-type transistor are formed in the peripheral circuit region (II), the second source region 142, the second drain region 148, the third source region 151 and the third drain region 157 can be obtained by implanting N-type impurities and the P-type impurities into the second semiconductor pattern 112 and the third semiconductor pattern 115, respectively.

An insulation interlayer 160 can be formed on the gate insulation layer 118 to cover the first to the third gate electrodes 121, 127 and 130. The insulation interlayer 160 can also cover the upper electrode 124 of the storage capacitor. The insulation interlayer 160 can have a substantially uniform thickness along a profile of the first to the third gate electrodes 121, 127 and 130 and the upper electrode 124. Hence, the insulation interlayer 160 can have stepped portions adjacent to the first to the third gate electrodes 121, 127 and 130 and the upper electrode 124. The insulation interlayer 160 can be formed using a silicon compound. The insulation interlayer 160 can be formed using silicon oxide, silicon nitride, silicon oxynitride, silicon carbonitride, silicon oxycarbide, and the like. These can be used alone or in a combination thereof. The insulation interlayer 160 can have a single-layered structure or a multi-layered structure including a silicon oxide film, a silicon nitride film, a silicon oxynitride film, a silicon carbonitride film and/or a silicon oxycarbide film. The insulation interlayer 160 can be obtained by a spin coating process, a chemical vapor deposition process, a plasma enhanced chemical vapor deposition process, a high density plasma-chemical vapor deposition process, and the like.

Figure 4:
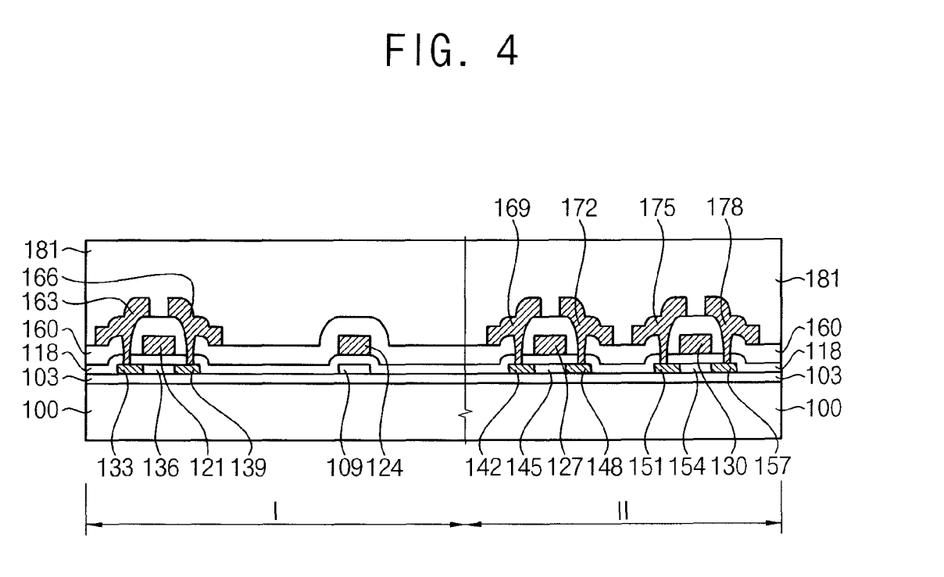

Referring to FIG. 4, a first source electrode 163, a second source electrode 169 and a third source electrode 175 can be formed on the insulation interlayer 160. A first drain electrode 166, a second drain electrode 172 and a third drain electrode 178 can be formed on the insulation interlayer 160. The first source electrode 163 can be separated from the first drain electrode 166 by a predetermined distance substantially centered around the first gate electrode 121. The second source electrode 169 can be spaced apart from the second drain electrode 172 by a predetermined distance substantially centered around the second gate electrode 127. The third source electrode 175 and the third drain electrode 178 can be separated from each other by a predetermined distance substantially centered around the third gate electrode 130. The first to the third source electrodes 163, 169 and 175 can pass through the insulation interlayer 160 to make contact with the first to the third source regions 133, 142 and 151, respectively. The first to the third drain electrodes 166, 172 and 178 can pass through the insulation interlayer 160 to be connected with the first to the third drain regions 139, 148 and 157, respectively.

In some embodiments, after forming contact holes partially exposing the first to the third source regions 133, 142 and 151 and the first to the third drain regions 139, 148 and 157 by etching the insulation interlayer 160, a second conductive layer (not illustrated) can be formed on the insulation interlayer 160 to fill the contact holes. The second conductive layer can be patterned to form the first to the third source electrodes 163, 169 and 175 and the first to the third drain electrodes 166, 172 and 178. The second conductive layer can be formed by a sputtering process, a chemical vapor deposition process, a pulsed laser deposition process, a vacuum evaporation process, an atomic layer deposition process, a printing process, and the like. Each of the first to the third source electrodes 163, 169 and 175 and each of the first to the third drain electrodes 166, 172 and 178 can be formed using metal, alloy, metal nitride, conductive metal oxide, a transparent conductive material, and the like. The first to the third source electrodes 163, 169 and 175 and the first to the third drain electrodes 166, 172 and 178 can be formed using aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like, respectively. These can be used alone or in a combination thereof. Each of the first to the third source electrodes 163, 169 and 175 and each of the first to the third drain electrodes 166, 172 and 178 can have a single-layered structure or a multi-layered structure including a metal film, an alloy film, a metal nitride film, a conductive metal oxide film and/or a transparent conductive material film.

A data line (not illustrated) can be formed on the insulation interlayer 160 in the pixel region (I). The data line can extend along a second direction substantially perpendicular to the first direction where the gate line extends. The date line can be connected to the first source electrode 163.

In some embodiments, the first transistor, the second transistor and the third transistors can be provided on the first substrate 100 as formations of the first to the third source electrodes 163, 169 and 175 and the first to the third drain electrodes 166, 172 and 178. The first transistor can be disposed in the pixel region (I), and the second and the third transistors can be disposed in the peripheral circuit region (II). In such embodiments, the first transistor can serve as a driving device, and the second and third transistors can serve as switching devices. The first transistor can include the first semiconductor pattern 106, the first gate electrode 121, the first source electrode 163 and the first drain electrode 166. The second transistor can include the second semiconductor pattern 112, the second gate electrode 127, the second source electrode 169 and the second drain electrode 172. The third transistor can include the third semiconductor pattern 115, the third gate electrode 130, the third source electrode 175 and the third drain electrode 178.

In some embodiments, a plurality of pixels can be disposed in the pixel region (I) of the organic light emitting display device, and a plurality of first transistors for the pixels can be formed in the pixel region (I). A gate driver can be formed in the peripheral circuit region (II) of the organic light emitting display device. The gate driver can include the second transistor, the third transistor, a shift resistor, and other components. Peripheral circuits including a data driver (not illustrated), a timing controller (not illustrated) and the gate driver can be disposed in the peripheral circuit region (II).

Referring still to FIG. 4, an insulation layer 181 can be formed on the insulation interlayer 160 to cover the first to the third source electrodes 163, 169 and 175 and the first to the third drain electrodes 166, 172 and 178. The insulation layer 181 can have a substantially level upper face to fully cover the first to the third source electrodes 163, 169 and 175 and the first to the third drain electrodes 166, 172 and 178. The insulation layer 181 can be formed using a transparent insulation material, silicon compound, metal compound, and the like. The insulation layer 181 can include photoresist, acryl-based resin, epoxy-based resin, phenol-based resin, polyamide-based resin, polyimide-based resin, unsaturated polyester-based resin, polyphenylene-based resin, polyphenylenesulfide-based resin, benzocyclobutene (BCB), silicon oxide, silicon nitride, silicon oxynitride, silicon oxycarbide, silicon barbonitride, aluminum oxide, titanium oxide, tantalum oxide, magnesium oxide, zinc oxide, hafnium oxide, zirconium oxide, titanium oxide, and the like. These can be used alone or in a combination thereof. The insulation layer 181 can be obtained by a spin coating process, a printing process, a chemical vapor deposition process, an atomic layer deposition process, a plasma enhanced chemical vapor deposition process, a high density plasma-chemical vapor deposition process, a vacuum evaporation process, and the like.

Figure 5:
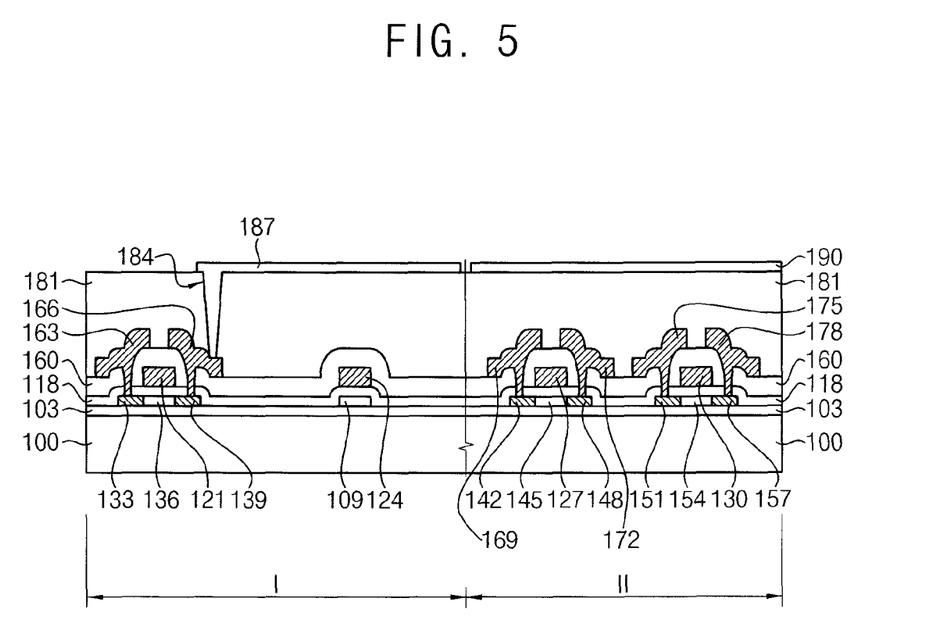

Referring to FIG. 5, after forming a first opening 184 exposing the first drain electrode 166 by partially etching the insulation layer 181, a first electrode 187 and a protection structure 190 can be formed on the insulation layer 181. The first electrode 187 can be disposed in the pixel region (I), and the protection structure 190 can be positioned in the peripheral circuit region (II).

In some embodiments, a third conductive layer (not illustrated) can be formed on the insulation layer 181 to fill the first opening 184 of the insulation layer 181. The third conductive layer can be formed by a sputtering process, a chemical vapor deposition process, an atomic layer deposition process, a printing process, a vacuum evaporation process, a pulsed laser deposition process, and the like. The third conductive layer can extend on the insulation layer 181 from the pixel region (I) to the peripheral circuit region (II). The third conductive layer can be patterned by a photolithography process or an etching process using a hard mask. Thus, the first electrode 187 can be formed on the insulation layer 181 in the pixel region (I), and the protection structure 190 can be simultaneously formed on the insulation layer 181 in the peripheral circuit region (II). The first electrode 187 can be formed on an exposed portion of the first drain electrode 166, a sidewall of the first opening 184 and the insulation layer 181 in the pixel region (I).

In some embodiments, the protection structure 190 can be separated from the first electrode 187 by a predetermined distance. The protection structure 190 can protect the peripheral circuits including the gate driver, the data driver and the timing controller disposed under the protection structure 190 in the peripheral circuit region (II) because the protection structure 190 can prevent damage to the peripheral circuits caused by static electricity generated from the first substrate 100 in the above-described processes and/or static electricity generated in subsequent processes. The protection structure 190 can be electrically connected to a second electrode 199 (see FIG. 6) commonly shared by the pixels of the organic light emitting display device, so that the protection structure 190 can effectively dissipate the static electricity generated by processes for manufacturing the organic light emitting display device. The protection structure 190 can have a shape for entirely covering the gate driver, the data driver, the timing controller, and other components.

In some embodiments, a plurality of protection structures 190 can be formed on the insulation layer 181 in the peripheral circuit region (II). In such embodiments, the protection structures 190 can cover the peripheral circuits such as the gate driver, the data driver and the timing controller, respectively. The protection structures 190 can be formed on the insulation layer 181 in the peripheral circuit region (II) by patterning the third conductive layer disposed in the peripheral circuit region (II). The protection structures 190 can have planar shapes substantially the same as or substantially similar to those of the peripheral circuits positioned in the peripheral circuit region (II).

In some embodiments, the first electrode 187 can include a material substantially the same as or substantially similar to that of the protection structure 190. Each of the first electrode 187 and the protection structure 190 can be formed using a transparent conductive material, metal, alloy, metal nitride, conductive metal oxide, and the like. The transparent conductive material in the first electrode 187 and the protection structure 190 can include indium tin oxide (ITO), indium zinc oxide (IZO), zinc tin oxide (ZTO), zinc oxide, tin oxide, indium oxide, gallium oxide, and the like. These can be used alone or in a combination thereof. When the first electrode 187 and the protection structure 190 are simultaneously formed, each of the first electrode 187 and the protection structure 190 can have a single-layered structure or a multi-layered structure including a transparent conductive material film, a metal film, an alloy film, a metal nitride film and/or a conductive metal oxide film.

In some embodiments, the first electrode 187 can include a material different from that of the protection structure 190. The first electrode 187 and the protection structure 190 can include substantially different transparent conductive materials, substantially different metals, substantially different alloys, substantially different metal nitrides, substantially different conductive metal oxides, and the like. In such embodiments, after forming the first electrode 187 on the insulation layer 181 in the pixel region (I), the protection structure 190 can be formed on the insulation layer 181 in the peripheral circuit region (II). In some embodiments, the protection structure 190 can be formed on the insulation layer 181 in the peripheral circuit region (II), and then the first electrode 187 can be formed on the insulation layer 181 in the pixel region (I).

Figure 6:
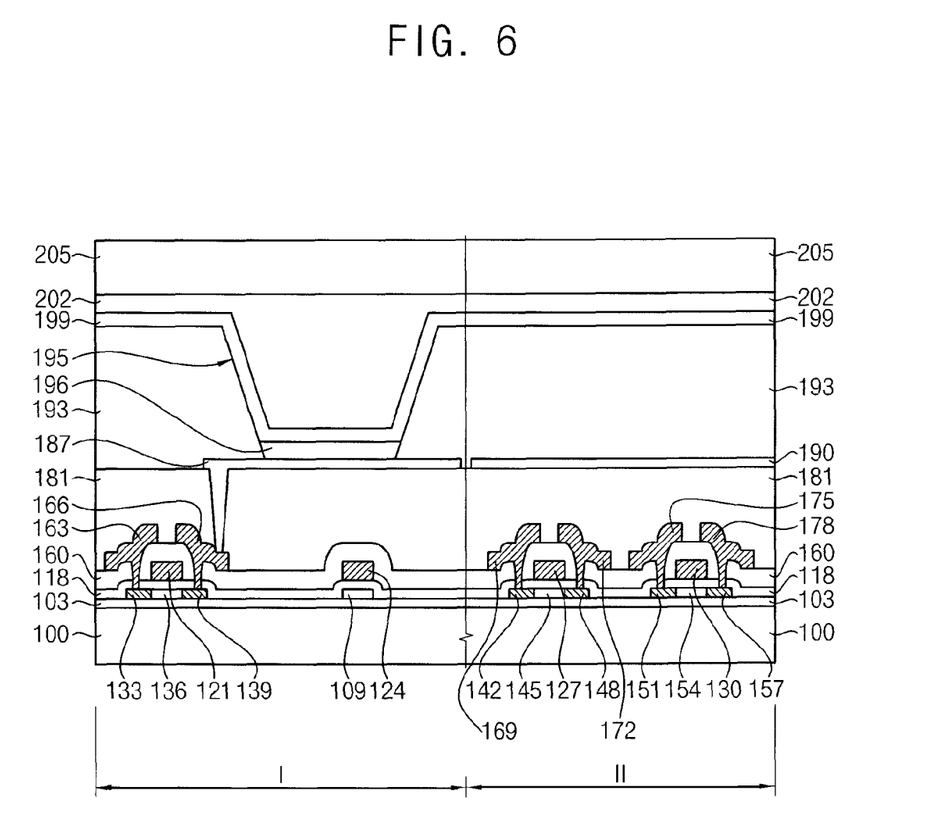

Referring to FIG. 6, a pixel defining layer 193 can be formed on the insulation layer 181, the first electrode 197 and the protection structure 190. The pixel defining layer 193 can be formed using an organic material or an inorganic material. The pixel defining layer 193 can be formed using photoresist, polyacryl-based resin, polyimide-based resin, acryl-based resin, silicon compound, and the like.

A second opening 195 can be formed to expose a portion of the first electrode 187 in the pixel region (I) by partially etching the pixel defining layer 193. When the second opening 195 is formed through the pixel defining layer 193, a display region can be defined in the pixel region (I) of the organic light emitting display device. A portion of the pixel region (I) can correspond to the display region where the second opening 195 of the pixel defining layer 193 is positioned, and other portions in the pixel region (I) can correspond to a non-display region. The second opening 195 of the pixel defining layer 193 can have a lower width substantially smaller than an upper width of the second opening 195. The second opening 195 of the pixel defining layer 193 can have a sidewall substantially inclined by a predetermined angle. In some embodiments, one second opening 195 of the pixel defining layer 193 can be formed in the pixel region (I). In other embodiments, a plurality of second openings 195 can be formed in the pixel region (I) to expose portions of the first electrode 187, respectively.

A light emitting structure 196 can be formed on the portion of the first electrode 187 exposed by the second opening 195 of the pixel defining layer 193. The light emitting structure 196 can include a light emitting layer (EL), a hole injection layer (HIL), a hole transport layer (HTL), an electron transport layer (ETL), an electron injection layer (EIL), and the like. In some embodiments, the light emitting layer of the light emitting structure 196 can be formed using light emitting materials for generating different colors of light such as a red color of light, a green color of light and a blue color of light in accordance with the pixels of the organic light emitting display device. In some embodiments, the light emitting layer of the light emitting structure 196 can have a multi-layered structure for generating a white color of light by successively depositing a plurality of light emitting materials for generating different colors of light such as a red color of light, a green color of light and a blue color of light.

The light emitting structure 196 can make contact with the first electrode 187 and the pixel defining layer 193. A lower face of the light emitting structure 196 can contact the first electrode 187, and a lateral portion of the light emitting structure 196 can make contact with the pixel defining layer 193. A sidewall of the light emitting structure 196 can have an angle of inclination substantially the same as or substantially similar to that of the sidewall of the second opening 195. In embodiments where second opening 195 is formed through the pixel defining layer 193, one light emitting structure 196 can be formed on the first electrode 187. In embodiments where a plurality of second openings 195 are formed through the pixel defining layer 193, a plurality of light emitting structures 196 can be formed on the first electrode 187.

Referring still to FIG. 6, a second electrode 199 serving as a common electrode shared by the pixels can be formed on the pixel defining layer 193 and the light emitting structure 196. The second electrode 199 can extend from the pixel region (I) to the peripheral circuit region (II). The second electrode 199 can be electrically connected to the protection structure 190 in the peripheral circuit region (II). Thus, the protection structure 190 can prevent damage to various peripheral circuits in the peripheral circuit region (II) caused by the static electricity in the above-described processes and/or subsequent processes.

The second electrode 199 can be formed using metal, alloy, metal nitride, a transparent conductive material, conductive metal compound, and the like. The second electrode 199 can be formed by a sputtering process, a chemical vapor deposition process, an atomic layer deposition process, a printing process, a vacuum evaporation process, a pulsed laser deposition process, a printing process, and the like. In some embodiments, the second electrode 199 can be formed using a material substantially the same as or substantially similar to that of the protection structure 190. In some embodiments, the second electrode 199 can include a material substantially different from that of the protection structure 190. The second electrode 199 can have a predetermined angle of inclination in the display region according to the angle of the sidewall of the second opening 195 of the pixel defining layer 193.

A protection layer 202 can be formed on the second electrode 199. The protection layer 202 can be formed from the pixel region (I) to the peripheral circuit region (II). The protection layer 202 can be formed using an organic material or an inorganic material. The protection layer 202 can include photoresist, acryl-based polymer, polyimide-based polymer, polyamide-based polymer, siloxane-based polymer, polymer containing photosensitive acrylic carboxyl group, novolak resin, alkali-soluble resin, silicon oxide, silicon nitride, silicon oxynitride, silicon oxycarbide, silicon carbonitride, aluminum oxide, titanium oxide, tantalum oxide, magnesium oxide, zinc oxide, hafnium oxide, zirconium oxide, and the like. These can be used alone or in a combination thereof. The protection layer 202 can be obtained by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, and the like.

A second substrate 205 can be disposed on the protection layer 202 to provide the organic light emitting display device. The second substrate 205 can include a transparent insulation substrate such as a glass substrate, a quartz substrate, a transparent plastic substrate, a transparent ceramic substrate, and the like. In some embodiments, a predetermined space can be provided between the protection layer 202 and the second substrate 205 or between the protection layer 202 and the second electrode 199 in the display region. The space can be filled with an air, an inert gas such as a nitrogen gas and/or a resin having a light transmittance and a hydroscopicity.

Figure 7:
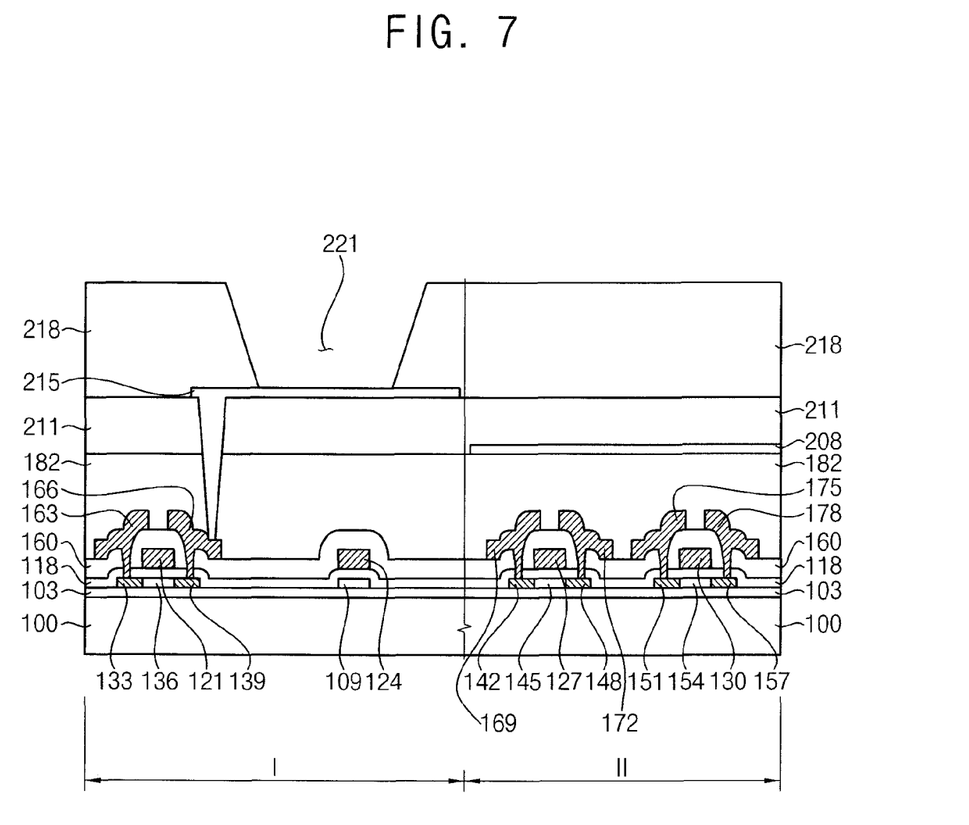
FIG. 7 is a cross-sectional view illustrating an embodiment of a display device.

FIG. 7 is a cross-sectional view illustrating an embodiment of a display device. An organic light emitting display device illustrated in FIG. 7 can include elements substantially the same as or substantially similar to those of the organic light emitting display device described with reference to FIG. 6, and therefore a detailed description of those elements is omitted.

Referring to FIG. 7, an embodiment of the organic light emitting display device can include an insulation layer having a first insulation film 182 and a second insulation film 211 disposed on a first substrate 100. The first substrate 100 can have a pixel region (I) and a peripheral circuit region (II).

The first insulation film 182 can cover a first transistor to a third transistor positioned on the first substrate 100. The first insulation film 182 can include a material substantially the same as or substantially similar to that of the insulation layer 182 described with reference to FIG. 4. The first insulation film 182 can be formed by a process substantially the same as or substantially similar to that for forming the insulation layer 182 described with reference to FIG. 4.

A protection structure 208 can be disposed on the first insulation film 182 in the peripheral circuit region (II) of the organic light emitting display device. The protection structure 208 can include a transparent conductive material, metal, alloy, metal nitride, conductive metal oxide, and the like. The protection structure 208 can include aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, zinc tin oxide, and the like. These can be used alone or in a combination thereof. The protection structure 208 can have a single-layered structure or a multi-layered structure including a transparent conductive material film, a metal film, an alloy film, a metal nitride film and/or a conductive metal oxide film. In some embodiments, after forming a conductive layer (not illustrated) on the first insulation film 182, the protection structure 208 can be formed in the peripheral circuit region (II) by patterning the conductive layer.

The protection structure 208 can protect peripheral circuits including the second and the third transistors in the peripheral circuit region (II) from being damaged by static electricity. The peripheral circuits including a data driver, a timing controller and a gate driver having the second and the third transistors can be disposed in peripheral circuit region (II). The protection structure 208 can have a shape entirely covering the peripheral circuits including the gate driver, the data driver and the timing controller. In some embodiments, a plurality of protection structures 208 can be disposed on the first insulation film 182 to cover the peripheral circuits, respectively.

The second insulation film 211 can be disposed on the first insulation film 182 in the pixel region (I) and on the protection structure 208 in the peripheral circuit region (II). The second insulation film 211 can include a material substantially the same as or substantially similar to that of the first insulation film 182. The second insulation film 211 can be formed by a process substantially the same as or substantially similar to that for forming the first insulation film 182.

A first electrode 215 can be disposed on the second insulation film 211 in the pixel region (I). The first electrode 215 can pass through the second insulation film 211 and the first insulation film 182. The first electrode 215 can be connected to a first drain electrode 166. In some embodiments, the first electrode 215 and the protection structure 208 can be disposed on one level. The protection structure 208 can have a thickness on the second insulation film 211 substantially the same as or substantially similar to that of the first electrode 215 on the second insulation film 211. In other embodiments, the first electrode 215 and the protection structure 208 can be positioned on different levels, respectively. A distance between the first substrate 100 and the first electrode 215 can be substantially larger than a distance between the first substrate 100 and the protection structure 208.

The first electrode 215 can include a transparent conductive material, metal, alloy, metal nitride, conductive metal oxide, and the like. The first electrode 215 can include aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, zinc tin oxide, and the like. These can be used alone or in a combination thereof. The first electrode 215 can have a single-layered structure or a multi-layered structure including a transparent conductive material film, a metal film, an alloy film, a metal nitride film and/or a conductive metal oxide film. In some embodiments, the first electrode 215 can include a material substantially the same as or substantially similar to that of the protection structure 208. In some embodiments, the first electrode 215 can include a material substantially different from that of the protection structure 208.

A pixel defining layer 218 can cover the first electrode 215 in the pixel region (I) and the second insulation film 211 in the peripheral circuit region (II). An opening 221 can be formed through the pixel defining layer 218 to expose a portion of the first electrode 215 to thereby define a display region of the organic light emitting display device.

A light emitting structure (not shown) can be disposed on the exposed portion of the first electrode 215 in the display region. A second electrode, a protection layer and a second substrate can be disposed on the light emitting structure and the pixel defining layer 218. These elements can be substantially the same as or substantially similar to those described with reference to FIG. 7.

Figure 8:
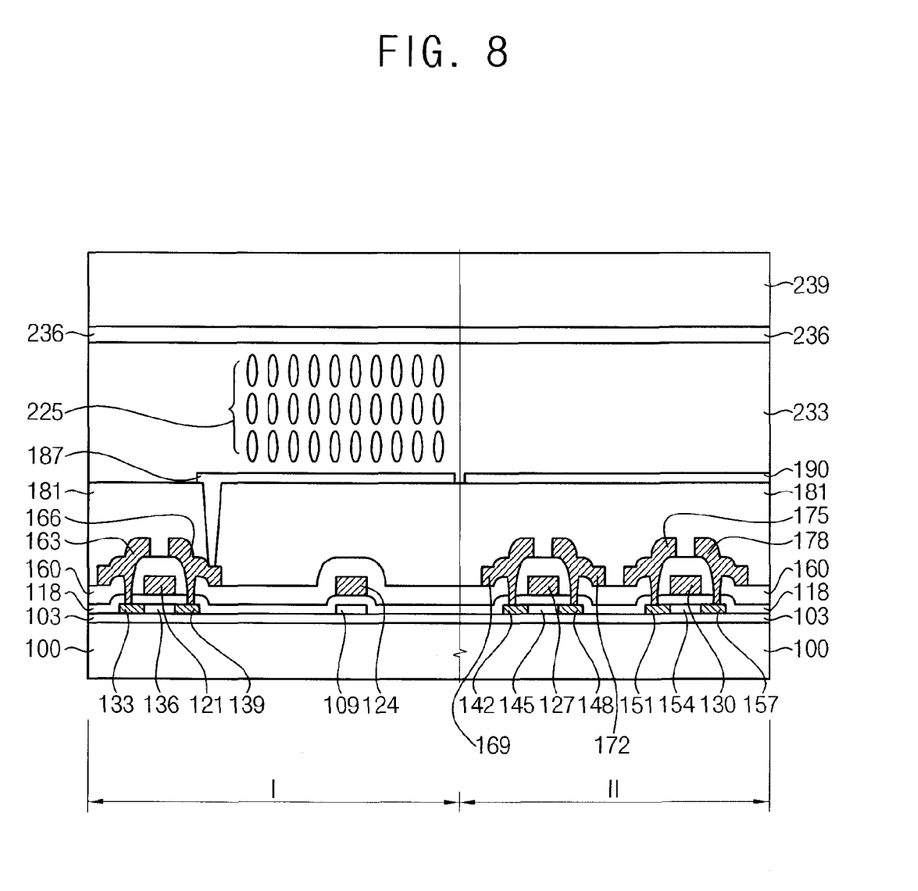
FIG. 8 is a cross-sectional view illustrating an embodiment of a display device.

FIG. 8 is a cross-sectional view illustrating an embodiment of a display device. A liquid crystal display device illustrated in FIG. 8 can include elements substantially the same as or substantially similar to those of the organic light emitting display device described with reference to FIG. 7, and therefore detailed description of those elements is omitted. The liquid crystal display device illustrated in FIG. 8 can be manufactured by processes substantially the same as or substantially similar to those described with reference FIGS. 1 to 6, except processes forming a liquid crystal layer 225, a sealant 233.

Referring to FIG. 8, the liquid crystal display device can include a first substrate 100, a first electrode 187, a protection structure 190, a liquid crystal layer 225, a second electrode 236, a second substrate 239, sealant 233.

At least one first transistor can be disposed in a pixel region (I) of the first substrate 100, and peripheral circuits including a gate driver, a data driver and timing controller can be disposed in a peripheral circuit region (II) of the first substrate 100. An insulation layer 181 can be positioned on the first substrate 100 to cover the lower structures including the transistor and the peripheral circuits.

A first polarization plate (not shown) can be disposed beneath the first substrate 100. The first polarization plate can have an optical axis substantially parallel to or substantially perpendicular to the liquid crystal layer 225. A second polarization plate (not shown), substantially corresponding to the first polarization plate, can be disposed on the second substrate 239. The second polarizing plate can also have an optical axis substantially parallel to or substantially perpendicular to the liquid crystal layer 225. A color filter (not shown) can be disposed between the second substrate 239 and the second electrode 236 in the pixel region (I), and a light blocking layer (not shown) can be positioned between the second substrate 239 and the second electrode 236 in the peripheral circuit region (II). A first alignment layer (not shown) can be located between the first electrode 187 and the liquid crystal layer 225 in the pixel region (I), and a second alignment layer (not shown) can be disposed between the liquid crystal layer 225 and the second electrode 236 in the peripheral circuit region (II).

In some embodiments, each of the first electrode 187 and the second electrode 236 can include a transparent material, and the protection structure 190 can include a transparent conductive material, metal, alloy, metal nitride, conductive metal oxide, and the like. In some embodiments, the protection structure 190 can include a material substantially the same as or substantially similar to that of the first electrode 187 and/or that of the second electrode 236. In other embodiments, the protection structure 190 can include a material substantially different from that of the first electrode 187 and/or that of the second electrode 236.

The first electrode 187 can be disposed on the insulation layer 181 in the pixel region (I), and the protection structure 190 can be located on the insulation layer 181 in the peripheral circuit region (II). The first electrode 187 and the protection structure 190 can be positioned on one level. In some embodiments, an insulation layer (not shown) can be formed on the first substrate 100. The insulation layer can have a construction substantially the same as or substantially similar to the insulation layer including the first insulation film 182 and the second insulation film 211 described with reference to FIG. 7. The protection structure 190 can be formed on a first insulation film of the insulation layer in the peripheral circuit region (II), whereas the first electrode 187 can be formed on a second insulation film of the insulation layer in the pixel region (II).

The liquid crystal layer 225 including a plurality of liquid crystal molecules can be located on the first electrode 187 in the pixel region. The sealant 233, or an insulation film can be disposed on the protection structure 190 in the peripheral circuit region (II). The liquid crystal layer 225 can be injected into a space provided by a spacer (not illustrated) between the first substrate 100 and the second substrate 239. A rubbing process can be performed about the first alignment layer and/or the second alignment layer in accordance with an orientation of the liquid crystal molecules in the liquid crystal layer 225. When the liquid crystal layer 225 includes twisted nematic (TN) type liquid crystal molecules, the rubbing process can be performed about the first alignment layer and/or the second alignment layer to thereby determine an initial orientation of the liquid crystal molecules. Substantial static electricity can be generated in the rubbing process, so that the peripheral circuit structures can be easily damaged.

The second electrode 236 and the second substrate 239 can be disposed on the liquid crystal layer 225 and the sealant 233. The second electrode 236 can extend from the pixel region (I) to the peripheral circuit region (II). The protection structure 190 can be electrically connected to the second electrode 236 in the peripheral circuit region (II), such that damages to the peripheral circuits caused by the static electricity can be effectively prevented. The static electricity can be generated in the rubbing process executed on the first alignment layer and/or the second alignment layer, so that the damages to the peripheral circuits can be caused. The static electricity can be dissipated by the protection structure 190, such that the damage to the peripheral circuits can be effectively prevented and failure of the liquid crystal display device can be reduced.

According to some embodiments, a display device can include at least one protection structure entirely or respectively covering peripheral circuits, so that the protection structure can effectively prevent damage to the peripheral circuits caused by static electricity generated in processes for manufacturing the display device. Therefore, a failure of the display device can be reduced while improving a reliability of the display device.

The foregoing is illustrative of certain embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
  a substrate having a pixel region and a peripheral circuit region;
  a peripheral circuit disposed in the peripheral circuit region of the substrate;
  at least one insulation layer disposed on the substrate to cover the peripheral circuit; and
  at least one protection structure disposed on the insulation layer.

2. The display device of claim 1, wherein the at least one insulation layer entirely cover the peripheral circuit.

3. The display device of claim 1, wherein the peripheral circuit comprises at least one of a transistor, a gate driver, a data driver and a timing controller.

4. The display device of claim 1, further comprising:
  a transistor disposed in the pixel region of the substrate;
  a first electrode electrically connected to the transistor;
  a pixel defining layer disposed on the first electrode to expose a portion of the first electrode;
  a light emitting structure on the exposed portion of the first electrode; and
  a second electrode on the light emitting structure and the pixel defining layer.

5. The display device of claim 4, wherein the second electrode is electrically connected to the at least one protection structure in the peripheral circuit region.

6. The display device of claim 4, wherein the first electrode includes a material same as that of the at least one protection structure.

7. The display device of claim 6, wherein each of the first electrode and the protection structure includes a transparent conductive material.

8. The display device of claim 4, wherein the first electrode includes a material different from that of the protection structure.

9. The display device of claim 8, wherein the first electrode and the protection structure includes different materials respectively selected from the group consisting of metal, alloy, metal nitride and conductive metal oxide.

10. The display device of claim 4, wherein the at least one insulation layer comprises:
 a first insulation film covering the pixel region and the peripheral circuit region; and
 a second insulation film disposed on the first insulation film.

11. The display device of claim 10, wherein the at least one protection structure is disposed on the first insulation film, and the first electrode is disposed on the second insulation film.

12. The display device of claim 4, wherein the first electrode and the at least one protection structure are disposed on one level or on different levels.

13. The display device of claim 1, wherein a plurality of protection structures covers the peripheral circuits, respectively.

14. The display device of claim 1, further comprising:
 a transistor disposed in the pixel region of the substrate;
 a first electrode electrically connected to the transistor;
 a liquid crystal layer on the first electrode; and
 a second electrode on the liquid crystal layer.

15. A method of manufacturing a display device, comprising:
 forming peripheral circuits in a peripheral circuit region of a substrate having a pixel region and the peripheral circuit region;
 forming at least one insulation layer covering the peripheral circuit; and
 forming at least one protection structure on the at least one insulation layer in the peripheral circuit region.

16. The method of claim 15, further comprising:
 forming a first electrode on the at least one insulation layer in the pixel region;
 forming a pixel defining layer on the first electrode to expose a portion of the first electrode;
 forming a light emitting structure on the exposed portion of the first electrode; and
 forming a second electrode on the light emitting structure and the pixel defining layer.

17. The method of claim 16, wherein forming the at least one protection structure and forming the first electrode comprise:
 forming a conductive layer on the at least one insulation layer; and
 patterning the conductive layer to form the first electrode and the at least one protection structure in the pixel region and the peripheral circuit region, respectively.

18. The method of claim 16, wherein forming the at least one insulation layer, forming the at least one protection structure and forming the first electrode:
 forming a first insulation film on the substrate to cover the peripheral circuit;
 forming the at least one protection structure on the first insulation film in the peripheral circuit region;
 forming a second insulation film on the first insulation film and the at least one protection structure; and
 forming the first electrode on the second insulation film in the pixel region.

19. The method of claim 15, wherein forming the at least one protection structure comprises:
 forming a conductive layer on the at least one insulation later; and
 patterning the conductive layer to form one protection structure entirely covering the peripheral circuits or to form a plurality of protection structures covering the peripheral circuits, respectively.

20. The method of claim 15, further comprising:
 forming a first electrode on the at least one insulation layer in the pixel region;
 forming a liquid crystal layer on the first electrode; and
 forming a second electrode on the liquid crystal layer.

* * * * *